United States Patent
Jo et al.

(10) Patent No.: US 12,457,792 B2
(45) Date of Patent: Oct. 28, 2025

(54) THIN FILM STRUCTURE AND ELECTRONIC DEVICE INCLUDING THE SAME

(71) Applicant: Samsung Electronics Co., Ltd., Suwon-si (KR)

(72) Inventors: Sanghyun Jo, Seoul (KR); Jinseong Heo, Suwon-si (KR); Hyangsook Lee, Suwon-si (KR); Sangwook Kim, Osan-si (KR); Yunseong Lee, Osan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/635,385

(22) Filed: Apr. 15, 2024

(65) Prior Publication Data

US 2024/0266418 A1   Aug. 8, 2024

Related U.S. Application Data

(62) Division of application No. 17/036,469, filed on Sep. 29, 2020, now abandoned.

(30) Foreign Application Priority Data

Sep. 30, 2019 (KR) .................. 10-2019-0120539

(51) Int. Cl.
  *H10D 64/68* (2025.01)
  *H01L 21/02* (2006.01)
  *H10D 1/68* (2025.01)

(52) U.S. Cl.
  CPC ..... *H10D 64/691* (2025.01); *H01L 21/02181* (2013.01); *H01L 21/02194* (2013.01);
  (Continued)

(58) Field of Classification Search
  CPC ............... H10D 64/691; H10D 64/689; H01L 21/02181; H01L 21/02194; H01L 21/022
  See application file for complete search history.

(56) References Cited

U.S. PATENT DOCUMENTS

| | | |
|---|---|---|
| 8,841,184 B2 | 9/2014 | Lee et al. |
| 2002/0142552 A1 | 10/2002 | Wu |

(Continued)

FOREIGN PATENT DOCUMENTS

| | | |
|---|---|---|
| CN | 108511517 A | 9/2018 |
| CN | 109087949 A | 12/2018 |

(Continued)

OTHER PUBLICATIONS

Japanese Office Action dated Jun. 10, 2024 for corresponding Japanese Patent Application No. 2020/163497 and its English-language translation.

(Continued)

*Primary Examiner* — Erik Kielin
(74) *Attorney, Agent, or Firm* — HARNESS, DICKEY & PIERCE, P.L.C.

(57) ABSTRACT

Disclosed herein is a thin film structure, including a first conductive layer on a dielectric layer including a plurality of layers. Each of the plurality of layers includes a dopant layer containing a dopant A and a HfO$_2$ layer to form a compound of Hf$_x$A$_{1-x}$O$_z$ (0<x<1, z is a real number). An uppermost layer of the plurality of layers is thickest among the plurality of layers. The first conductive layer contacts the uppermost layer.

14 Claims, 19 Drawing Sheets

(52) U.S. Cl.
CPC ...... *H01L 21/022* (2013.01); *H01L 21/02356* (2013.01); *H10D 1/68* (2025.01); *H10D 64/689* (2025.01); *H10D 64/685* (2025.01)

(56) References Cited

U.S. PATENT DOCUMENTS

| | | | |
|---|---|---|---|
| 2003/0086287 A1* | 5/2003 | Salling | H10B 51/30 365/145 |
| 2004/0023461 A1 | 2/2004 | Ahn et al. | |
| 2005/0118780 A1 | 6/2005 | Balakumar et al. | |
| 2006/0176645 A1 | 8/2006 | Ahn et al. | |
| 2006/0189154 A1 | 8/2006 | Ahn et al. | |
| 2007/0049051 A1 | 3/2007 | Ahn et al. | |
| 2007/0051998 A1 | 3/2007 | Kil et al. | |
| 2008/0203529 A1 | 8/2008 | Kang et al. | |
| 2009/0068808 A1 | 3/2009 | Chae et al. | |
| 2009/0261395 A1 | 10/2009 | Boescke | |
| 2012/0108020 A1 | 5/2012 | Baldwin et al. | |
| 2015/0017813 A1 | 1/2015 | Akiyama et al. | |
| 2017/0162250 A1 | 6/2017 | Slesazeck et al. | |
| 2018/0130909 A1 | 5/2018 | Sakai et al. | |
| 2018/0240804 A1 | 8/2018 | Yoo | |
| 2018/0366476 A1 | 12/2018 | Liu | |
| 2019/0066917 A1 | 2/2019 | Nahar et al. | |
| 2020/0176582 A1 | 6/2020 | Rode et al. | |

FOREIGN PATENT DOCUMENTS

| | | |
|---|---|---|
| JP | 2002/319583 A | 10/2002 |
| JP | 2004/336044 A | 11/2004 |
| KR | 100996884 B1 | 11/2010 |

OTHER PUBLICATIONS

Chinese Office Action dated Aug. 13, 2024 for corresponding Chinese Patent Application No. 202011060074.6 and its English-language translation.

Min Hyuk Park et al., 'Surface and grain boundary energy as the key enabler to ferroelectricity in nanoscale hafnia-zirconia: comparison of model and experiment' Nanoscale, 2013.

Stephen Larsen Weeks et al.,'Engineering of Ferroelectric HfO2-ZrO2 Nanolaminates' ACS Applied Materials & Interfaces, 2017.

Johannes Müller et al., 'Ferroelectricity in Simple Binary ZrO2 and HfO2' Nano Letters, vol. 12, 2012, pp. 4318-4323.

Extended European Search Report dated Feb. 8, 2021, issued in corresponding European Patent Application No. 20198088.5.

Werner et al., Atomic layer deposition of Ti-HfO2 dielectrics, J. of Vacuum Sci. & Tech A 31, 01A102 (2013).

* cited by examiner

THIN FILM STRUCTURE AND ELECTRONIC DEVICE INCLUDING THE SAME

CROSS-REFERENCE TO RELATED APPLICATION

This application is a divisional of U.S. application Ser. No. 17/036,469, filed Sep. 29, 2020, which claims the benefit of Korean Patent Application No. 10-2019-0120539, filed on Sep. 30, 2019, in the Korean Intellectual Property Office, the disclosure of which is incorporated herein in its entirety by reference.

BACKGROUND

1. Field

The present disclosure relates to a thin film structure and/or an electronic device including the same.

2. Description of Related Art

With the down-scaling of integrated circuit devices, a space occupied by electronic devices such as transistors and capacitors included therein has been rapidly reduced. There may be a need for a material that can overcome these spatial limitations and exhibit good operation characteristics.

$HfO_2$ is a core material used for high-k dielectric materials in electronic devices. In order to increase the dielectric constant and stability of this material, various studies on doping materials and methods are being actively conducted. Recently, it has been reported that an $HfO_2$ thin film doped with Zr, Si, Al, La, Y, etc. may exhibit ferroelectricity when it has a desired (and/or alternatively predetermined) thickness or less. Ferroelectricity has a negative capacitance effect, which can drastically reduce the power consumption of an electronic device employing a ferroelectric material.

Accordingly, researches on low power logic devices, nonvolatile memories, capacitors, or the like, using a $HfO_2$-based dielectric material, have been actively conducted.

SUMMARY

Provided are doped $HfO_2$ thin films, manufacturing methods thereof, and electronic devices using the same.

Additional aspects will be set forth in part in the description which follows and, in part, will be apparent from the description, or may be learned by practice of the presented embodiments of the disclosure.

According to an embodiment, a thin film structure includes: a dielectric layer including a plurality of layers and a first conductive layer on the dielectric layer. Each of the plurality of layers includes a dopant layer containing a dopant A and a $HfO_2$ layer to form a compound of $Hf_xA_{1-x}O_z$ ($0<x<1$, z is a real number), wherein an uppermost layer of the plurality of layers is thickest among the plurality of layers. The first conductive layer contacts the uppermost layer of the plurality of layers.

In some embodiments, the uppermost layer may have a thickness of 0.25 nm or more.

In some embodiments, the dielectric layer may include a first layer among the plurality of layers. The first layer may have a thickness of $i*t$ (i is an integer, and t is a real number) and include $HfO_2$. The uppermost layer may contain the dopant A and have a thickness of $j*t$ ($j \geq i$, j is an integer of 3 or more).

In some embodiments, the dielectric layer may further include a second layer and a third layer among the plurality of layers. The second layer may be on the first layer, have a thickness of $j*t$, and contain a dopant A. The third layer may be on the second layer, have a thickness of $i*t$, and include $HfO_2$, wherein $j>i$ is satisfied. Pairs of the second layer and the third layer may be repeatedly disposed between the first layer and the uppermost layer.

In some embodiments, the dielectric layer may further include a second layer and a third layer among the plurality of layers. The second layer may be on the first layer, have a thickness of $m*t$ ($i<m<j$, m is an integer), and contain a dopant A. The third layer may be on the second layer, have a thickness of $n*t$ ($i<n<j$, n is an integer), and include $HfO_2$, wherein $j>i$ is satisfied. Pairs of the first layer and the second layer may be repeatedly disposed under the third layer.

In some embodiments, the dielectric layer may further include a second layer and a third layer among the plurality of layers. The second layer may be on the first layer, having a thickness of $i*t$, and contain a dopant A. The third layer may be on the second layer, have a thickness of $j*t$, and include $HfO_2$. Pairs of the first layer and the second layer may be repeatedly disposed under the third layer.

In some embodiments, the dielectric layer may further include a second layer and a third layer among the plurality of layers. The second layer may be on the first layer, have a thickness of $k*t$ ($k<i$, k is an integer, wherein $i=j$ is satisfied), and contain a dopant A. The third layer may be on the second layer, have a thickness of $k*t$, and include $HfO_2$. Pairs of the second layer and the third layer may be repeatedly disposed between the first layer and the uppermost layer.

In some embodiments, the dielectric layer may include a first layer among the plurality of layers. The first layer may contain a dopant A, have a thickness of $i*t$ (i is an integer, and t is a real number), and include $HfO_2$. The uppermost layer may have a thickness of $j*t$ ($j>i$, j is an integer of 3 or more) and include $HfO_2$.

In some embodiments, the dielectric layer may further include a second layer and a third layer among the plurality of layers. The second layer may be on the first layer, have a thickness of $j*t$, and include $HfO_2$. The third layer may be on the second layer, have a thickness of $i*t$, and contain a dopant A. Pairs of the second layer and the third layer may be repeatedly disposed between the first layer and the uppermost layer.

In some embodiments, the dielectric layer may include a first layer and a second layer among the plurality of layers. The first layer may have a thickness of $i*t$ (i is an integer, and t is a real number) and include $HfO_2$. The second layer may be on the first layer, contain a dopant A, and have a thickness of $j*t$ ($j>i$). The uppermost layer have a thickness of $k*t$ ($k>i$, j) and including $HfO_2$.

In some embodiments, the dielectric layer may further include a first layer and a second layer among the plurality of layers. The first layer may contain a dopant A and have a thickness of $j*t$ (j is an integer, and t is a real number). The second layer may have a thickness of $i*t$ ($i>j$) and include $HfO_2$. The uppermost layer may have a thickness of $n*t$ ($n>i$, j) and include a dopant A.

In some embodiments, t may be 0.05 nm or more.

In some embodiment, t may be about 0.1 nm to about 0.9 nm.

In some embodiments, the dielectric layer may have a thickness of about 0.5 nm to about 20 nm.

In some embodiments, A may include any one of Zr, La, Y, Si, Al, and Sn.

In some embodiments, the first conductive layer may include any one of a metal, a conductive oxide, and graphene.

In some embodiments, the uppermost layer may be $HfO_2$.

In some embodiments, the uppermost layer may be $ZrO_2$.

In some embodiments, in the compound of $Hf_xA_{1-x}O_z$, z may be 2, and x may be in a range of 0.2 to 0.8.

In some embodiments, a material of a lowermost layer among the plurality of layers may be different than a material of the uppermost layer.

According to an embodiment, a method of manufacturing a thin film structure includes providing a substrate; forming a dielectric layer including a compound of $Hf_aA_bO_z$ (where a, b, z are real numbers) on the substrate, the dielectric layer including a plurality of layers, each of the plurality of layers including a dopant layer containing a dopant A and a $HfO_2$ layer, and an uppermost layer of the plurality of layers being thickest among the plurality of layers; and forming a conductive layer on the dielectric layer, the conductive layer contacting the uppermost layer.

In some embodiments, the method may further include setting a kind and the thickness of the uppermost layer depending on a content ratio of Hf and A in the dielectric layer.

In some embodiments, the content ratio in the dielectric layer may be a:b. The forming the dielectric layer may include forming the uppermost layer as an A-dopant layer in response to a case of a≤b, and the forming the dielectric layer may include forming the uppermost layer as a $HfO_2$ layer in response to a case of a>b.

In some embodiments, the method may further include: performing heat treatment. The heat treatment may be performed before the forming the conductive layer and after the forming the dielectric layer. Alternatively, the heat treatment may be performed after the forming the conductive layer.

According to another embodiment, an electronic device includes a semiconductor layer; and any one of the aforementioned thin film structures on the semiconductor layer.

In some embodiments, the electronic device may further include an insulating layer between the semiconductor layer and the thin film structure.

In some embodiments, the electronic device may further include a second conductive layer between the insulating layer and the thin film structure.

According to another embodiment, an electronic device includes a second conductive layer and any one of the aforementioned thin film structures on the semiconductor layer.

In some embodiments, the electronic device may further include an insulating layer between the second conductive layer and the thin film structure.

BRIEF DESCRIPTION OF THE DRAWINGS

The above and other aspects, features, and effects of certain embodiments of the disclosure will be more apparent from the following description taken in conjunction with the accompanying drawings, in which.

DETAILED DESCRIPTION

Figure 1:
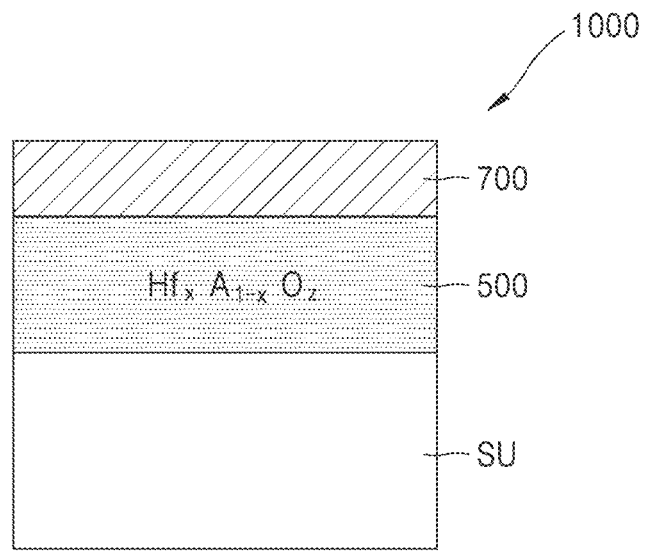
FIG. 1 is a schematic cross-sectional view of a thin film structure according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the present disclosure will be described in detail with reference to the accompanying drawings. Embodiments are merely example, and various modifications are possible from these embodiments. In the following drawings, like numbers refer to like elements, and the size of each element may be exaggerated for clarity and convenience of description. When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, when a part of a layer, film, region, plate, etc. is said to be "on" or "over" another part, it includes not only being directly on another part but also having another part therebetween.

Although the terms "first," "second," etc. may be used herein to describe various elements, these elements should not be limited by these terms. These terms are only used to distinguish one element from another element.

The singular forms "a," "an" and "the" are intended to include the plural forms as well, unless the context clearly indicates otherwise. When a part is said to "include" a component, this means that, unless specifically stated otherwise, it may further include other components rather than excluding other components.

The terms " . . . unit" and "module" described in the specification mean a unit that processes at least one function or operation, and may be implemented in hardware or software, or a combination of hardware and software.

The use of the term "above-described or aforementioned" and similar indicating terminology may correspond to both the singular form and the plural form.

The operations constituting the method may be performed in a suitable order, unless there is an explicit statement that they should be done in the order described. The use of all example terms (e.g., etc.) is merely for the purpose of describing the technical spirit in detail and is not intended to limit the scope of the rights as such terms are not limited by the claims.

Figure 2:
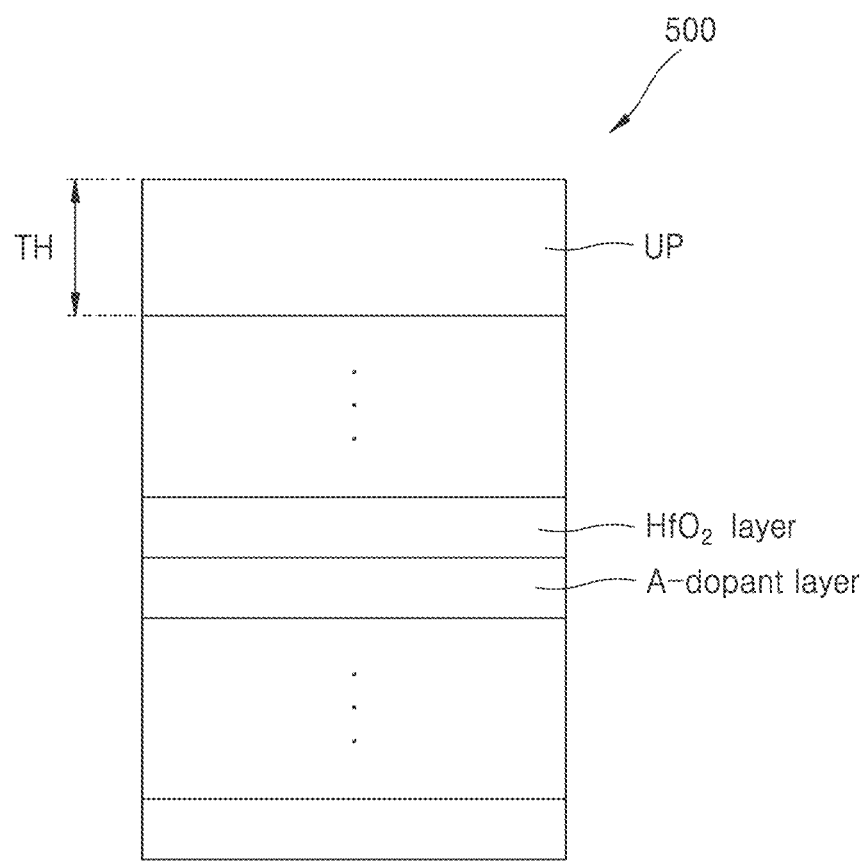
FIG. 2 is a cross-sectional view conceptually illustrating the structure of a dielectric layer employed in a thin film structure according to an embodiment.

FIG. 1 is a schematic cross-sectional view of a thin film structure according to an embodiment, and FIG. 2 is a cross-sectional view conceptually illustrating the structure of a dielectric layer employed in a thin film structure according to an embodiment.

A thin film structure 1000 includes a dielectric layer 500 and a first conductive layer 700 disposed on the dielectric layer 500.

The dielectric layer 500 includes a compound of $Hf_xA_{1-x}O_z$. Such a compound may be implemented by a multi-layer structure including a dopant layer having a dopant A and a $HfO_2$ layer.

The dopant A may include any one of transition metals such as Zr, La, and Y, Si, Al, and Sn, and may be a binary compound, a ternary compound or more. The dopant layer may include any one of transition metal-based oxide such as $ZrO_2$, $LaO_2$, or $YO_2$, and $SiO_2$, $Al_2O_3$, and $SnO_2$.

The first conductive layer 700 may include any one of a metal such as TiN, W, Mo, or Ni; a conductive oxide such as $RuO_2$, $SrRuO_3$, or ITO; and a 2D material such as graphene.

The layer number, thickness, and repetitive form of the plurality of layers constituting the dielectric layer 500 may be set in consideration of the composition ratio of $Hf_xA_{1-x}O_z$ (0<x<1, z is a real number), that is, the content ratio of Hf and A, and the thickness of the dielectric layer 500. The configuration of the plurality of layers may be determined to achieve a higher dielectric constant for the given content ratio of Hf and A.

In the thin film structure 1000 according to an embodiment, the thickness and composition of the uppermost layer UP of the dielectric layer 500, the uppermost layer contacting the first conductive layer 700, are appropriately set in order to implement the dielectric layer 500 having good crystallinity and a high dielectric constant.

In the plurality of layers constituting the dielectric layer 500, the thickness TH of the uppermost layer UP of the dielectric layer 500 may be thickest. The thickness of at least one of the plurality of layers may be equal to the thickness TH of the uppermost layer UP. In other words, the thickness of each of the plurality of layers is equal to or thinner than the thickness TH of the uppermost layer UP. The uppermost layer UP may be a $HfO_2$ layer, or may be an A-dopant layer including dopant A. Whether the uppermost layer UP is a $HfO_2$ layer or an A-dopant layer may be determined in consideration of the content ratio of Hf and A in the compound $Hf_xA_{1-x}O_z$ constituting the dielectric layer 500.

The thickness of the uppermost layer UP may be determined in consideration of the fact that the electrical properties of the dielectric layer 500 may vary depending on the thickness of the uppermost layer UP even when the composition of the dielectric layer 500 is the same. The thickness of the uppermost layer UP may be about 0.25 nm or more (e.g., about 0.25 nm to about 1 nm, 2 nm, 5 nm, or 10 nm).

The thickness of the dielectric layer 500 is a factor that affects other electrical properties such as dielectric constant of the dielectric layer 500, and may be set according to desired performance. The total thickness of the dielectric layer 500 may be about 0.5 nm to about 20 nm. However, the thickness of the uppermost layer UP and the thickness of the dielectric layer 500 are not limited thereto.

The dielectric layer 500 may be formed on a desired (and/or alternatively predetermined) substrate SU. The kind of the substrate SU is not particularly limited, and may be, for example, determined according to the structure of an electronic device in which the dielectric layer 500 is to be utilized.

Hereinafter, various embodiments of dielectric layers will be described. Embodiments include various structures that exhibit an improved dielectric constant. Such embodiments are deduced in consideration of the fact that, even when the composition of a dielectric layer is the same, the crystallinity of the dielectric layer is changed depending on the thickness or kind of an uppermost layer, and thus the dielectric constant thereof is also changed.

The following embodiments illustrate that the dielectric layer of FIG. 2 is variously implemented depending on the content ratio of Hf and A, but the implementation form of the dielectric layer 500 is not limited to example explanations to be described later. That is, as long as the requirements of the thickness and type of the uppermost layer UP are satisfied, the position, number and thickness of an $HfO_2$ layer and an A-dopant layer disposed under the uppermost layer UP may be variously changed.

Hereinafter, it will be described that the dopant A is a Zr and the A-dopant layer is $ZrO_2$ layer, but the present disclosure is not limited thereto, and the aforementioned various dopant materials may be employed in the dielectric layer.

Figure 3A:
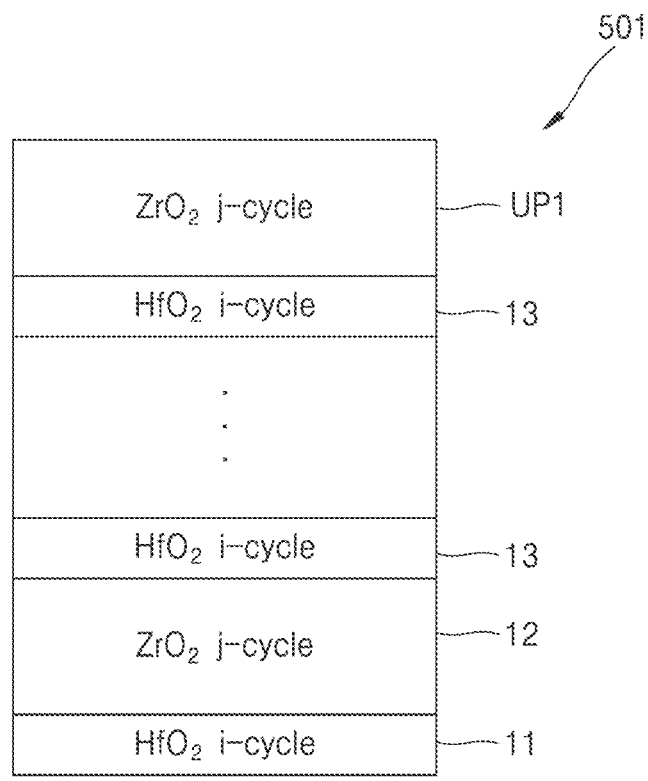
FIG. 3A is a cross-sectional view illustrating an example structure of a dielectric layer employed in a thin film structure according to an embodiment.
Figure 3B:
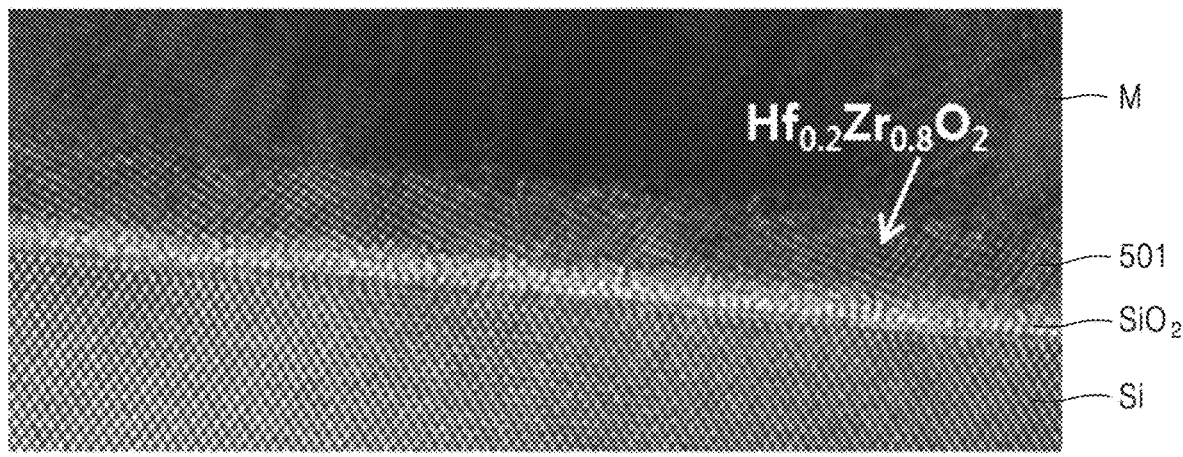
FIG. 3B is an electron microscope photograph of the dielectric layer of FIG. 3A.

FIG. 3A is a cross-sectional view illustrating an example structure of a dielectric layer employed in a thin film structure according to an embodiment. FIG. 3B is an electron microscope photograph of the dielectric layer of FIG. 3A.

A dielectric layer 501 includes a first layer 11 including $HfO_2$ prepared in i-cycles, and an uppermost layer UP1 including $ZrO_2$ prepared in j-cycles (j>i).

In order to form the dielectric layer 501, deposition methods, such as atomic layer deposition (ALD), metal organic atomic layer deposition (MOALD), chemical vapor deposition (CVD), metal organic chemical vapor deposition (MOCVD), and physical vapor deposition (PVD) may be used. Each of the above methods includes processes of placing a target substrate in a chamber, heating the chamber to a desired (and/or alternatively predetermined) temperature, and supplying a source material. Through these processes, the source material is deposited on the target substrate. Here, the cycle is a deposition unit that is determined at desired (and/or alternatively predetermined) process conditions including temperature and time. When the thickness formed in one cycle is t, the thickness of the first layer 11 is i*t, and the thickness of the uppermost layer UP1 is j*t. The thickness formed in one cycle is expressed by t, and t may be 0.05 nm or more. For example, t may be about 0.1 nm to about 0.9 nm, but is not limited thereto. Hereinafter, the expression 'i-cycles' may be used interchangeably with the expression 'thickness i*t'.

The dielectric layer 501 may further include a second layer 12 disposed on the first layer 11, having a thickness of j*t and including $ZrO_2$, and a third layer 13 disposed on the second layer 12, having a thickness of i*t and including $HfO_2$. Pairs of the second layer 12 and the third layer 13 may be repeatedly disposed between the first layer 11 and the uppermost layer UP1 several times. The number of repeated times may be determined in consideration of the overall thickness of the dielectric layer 501 to be formed.

When the content ratio of Hf and Zr in the dielectric layer 501 is a:b, a<b is satisfied, that is, i<j is satisfied. For example, j may be 3 or more (e.g., in a range of 3 to 10). A layer including $ZrO_2$ is formed to be thicker than a layer including $HfO_2$. The uppermost layer UP1 includes $ZrO_2$.

FIG. 3B is an electron microscope photograph of the dielectric layer 501 of FIG. 3A, and illustrates a case where i=1 and j=4 are satisfied, and pairs of $HfO_2$ 1-cycle and $ZrO_2$ 4-cycles are repeated five times.

The thin film shown in FIG. 3B is formed in the order of Si layer/$SiO_2$ layer/dielectric layer 502/metal layer M. The dielectric layer 502 forms $Hf_{0.2}Zr_{0.8}O_2$. The dielectric layer 501 exhibits good crystallinity as shown in the drawing.

Figure 4:
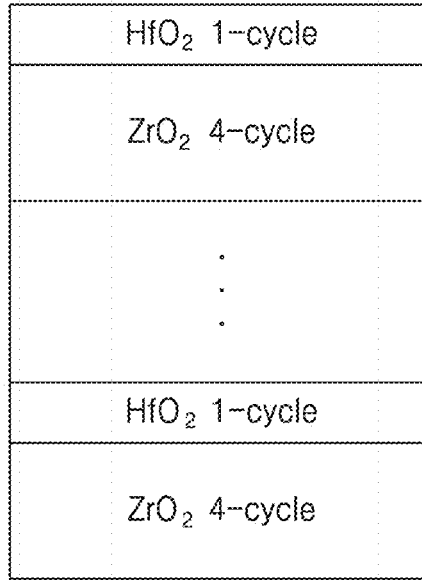
FIG. 4 is a cross-sectional view illustrating an example structure of a comparative dielectric layer to be compared with the dielectric layer of FIG. 3A.

FIG. 4 is a cross-sectional view illustrating an example structure of a comparative dielectric layer to be compared with the dielectric layer of FIG. 3A.

The dielectric layer 50 forms $Hf_{0.2}Zr_{0.8}O_2$ of the same composition as the dielectric layer 501 of FIG. 3A, but is different from the dielectric layer 501 in that first layers 1 of $ZrO_2$ 4-cycles and second layers 2 of $HfO_2$ 1-cycle are repeatedly disposed in this order.

Figure 5:
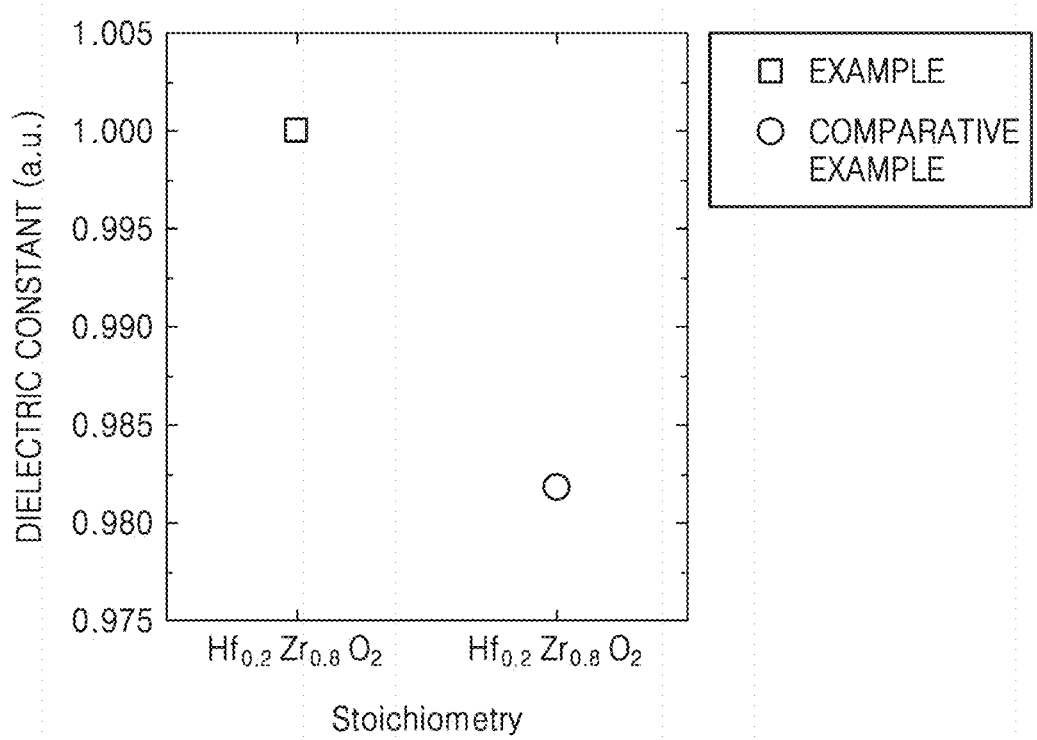
FIG. 5 is a graph comparing a dielectric constant of the dielectric layer of FIG. 3A with a dielectric constant of the comparative dielectric layer of FIG. 4.

FIG. 5 is a graph comparing a dielectric constant of the dielectric layer of FIG. 3A with a dielectric constant of the comparative dielectric layer of FIG. 4.

The dielectric layer 501 according to example embodiments exhibits a higher dielectric constant than the comparative dielectric layer 50. The reason for this is that crystallinity is changed depending on the shape (type, thickness) of the uppermost layer contacting the conductive layer even in the cases of the same composition. That is, in the case where the uppermost layer is a $HfO_2$ layer having a thickness of 1*t, lower crystallinity is exhibited as compared with the case where the uppermost layer is a $ZrO_2$ layer having a thickness of 4*t.

Figure 6:
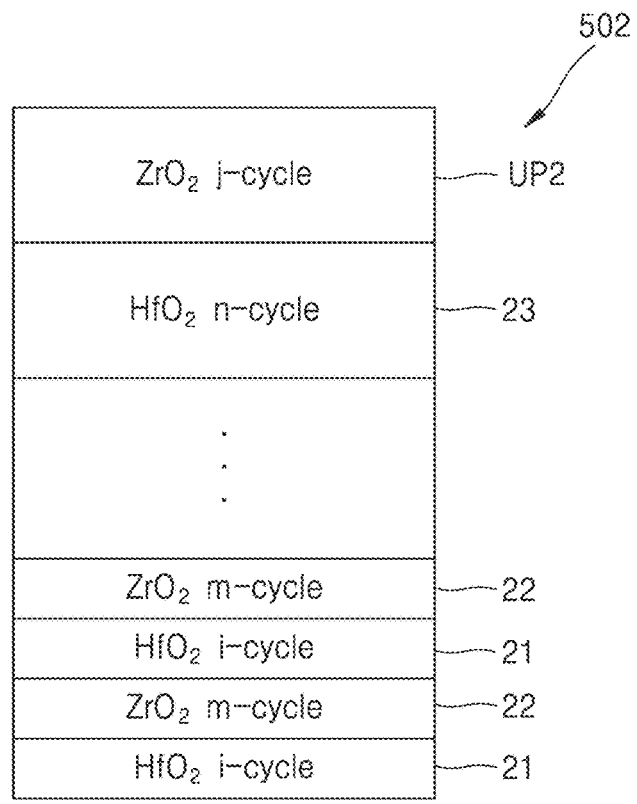
FIG. 6 is a cross-sectional view illustrating another example structure of a dielectric layer employed in a thin film structure according to another embodiment.

FIG. 6 is a cross-sectional view illustrating another example structure of a dielectric layer employed in a thin film structure according to another embodiment.

A dielectric layer 502 includes a first layer 21 including $HfO_2$ prepared in i-cycles, and an uppermost layer UP2 including $ZrO_2$ prepared in j-cycles (j>i). That is, the first layer 21 is an $HfO_2$ layer having a thickness of i*t, and the uppermost layer UP2 is a $ZrO_2$ layer having a thickness of j*t. j may be 3 or more.

The dielectric layer 502 may further include a second layer 22 disposed on the first layer 21, prepared in m-cycles, having a thickness of m*t (i≤m≤j) and including dopant A, and a third layer 23 disposed on the second layer 22, prepared in n-cycles, having a thickness of n*t (i≤n≤j) and including $HfO_2$. Pairs of the first layer 21 and the second layer 22 may be repeatedly disposed under the third layer 23.

When the content ratio of Hf and Zr in the dielectric layer 502 of the present embodiment, similarly to the aforementioned dielectric layer 501, is a:b, a<b is satisfied. In the dielectric layer 502 of the present embodiment, the thicknesses of the first layer 21 and the second layer 22 adjacent to each other are set depending on the above content condition, but the thicknesses of the uppermost layer UP2 and the third layer 23 closet thereto may be set to be thicker than the thicknesses of the second layer 22 and the first layer 11, respectively. For example, j may be 3 or more, and i:m=n:j may be satisfied. However, the present disclosure is not limited thereto.

Although it is illustrated in the embodiments of FIGS. 3A and 5 that the uppermost layer is set as a $ZrO_2$ layer when the content of Hf in each of the dielectric layer 501 and 502 is lower than the content of Zr in each of the dielectric layer 501 and 502, in another embodiment, even in this case, the uppermost layer may be set as a $HfO_2$ layer, and may be set to be thickest.

Figure 7:
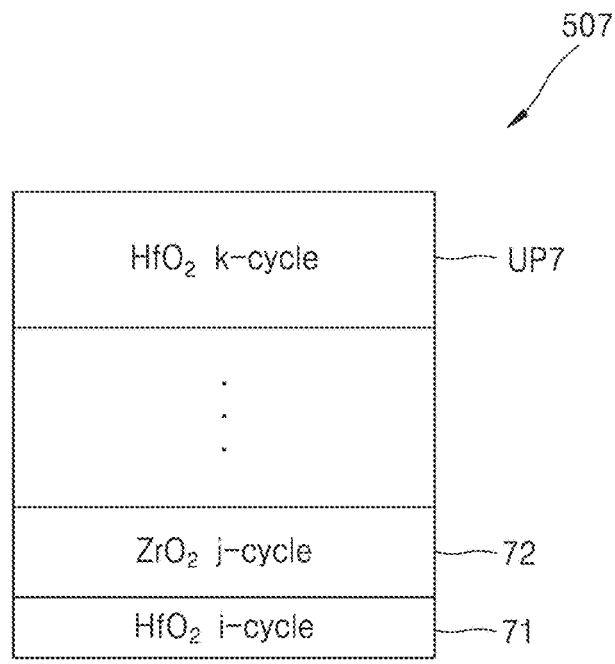
FIG. 7 is a cross-sectional view illustrating another example structure of a dielectric layer employed in a thin film structure according to still another embodiment.

FIG. 7 is a cross-sectional view illustrating another example structure of a dielectric layer employed in a thin film structure according to still another embodiment.

A dielectric layer 502 includes a first layer 71 including $HfO_2$ prepared in i-cycles, a second layer 72 including $ZrO_2$ prepared in j-cycles (j>i), and an uppermost layer UP7 including $HfO_2$ prepared in k-cycles (k>i, j). That is, the first layer 71 is an $HfO_2$ layer having a thickness of i*t, the second layer 72 is a $ZrO_2$ layer having a thickness of j*t, and the uppermost layer UP7 is a $HfO_2$ layer having a thickness of k*t (k>i, j). Among these layers, the uppermost layer UP7 is thickest.

The plurality of first layers 71 and the plurality of second layers 72 may repeatedly disposed. For example, the first layers 71 and the second layers 72 may repeatedly disposed R times. When the content of Hf in the dielectric layer 507 is lower than the content of Zr in the dielectric layer 507, k<R*(j−i) may be satisfied. For example, k=5, R=3, j=3, and i=1 may be satisfied. In addition, the dielectric layer 507 may be formed in various forms.

Figure 8A:
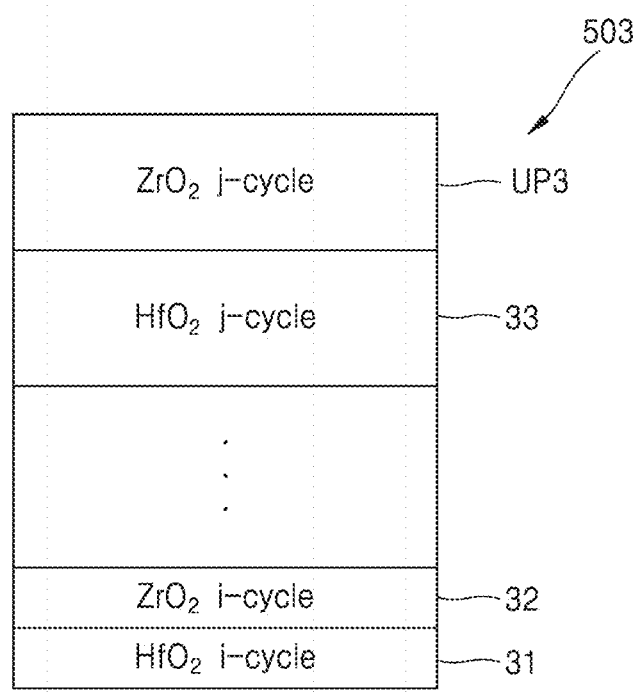
FIG. 8A is a cross-sectional view illustrating another example structure of a dielectric layer employed in a thin film structure according to still another embodiment.
Figure 8B:
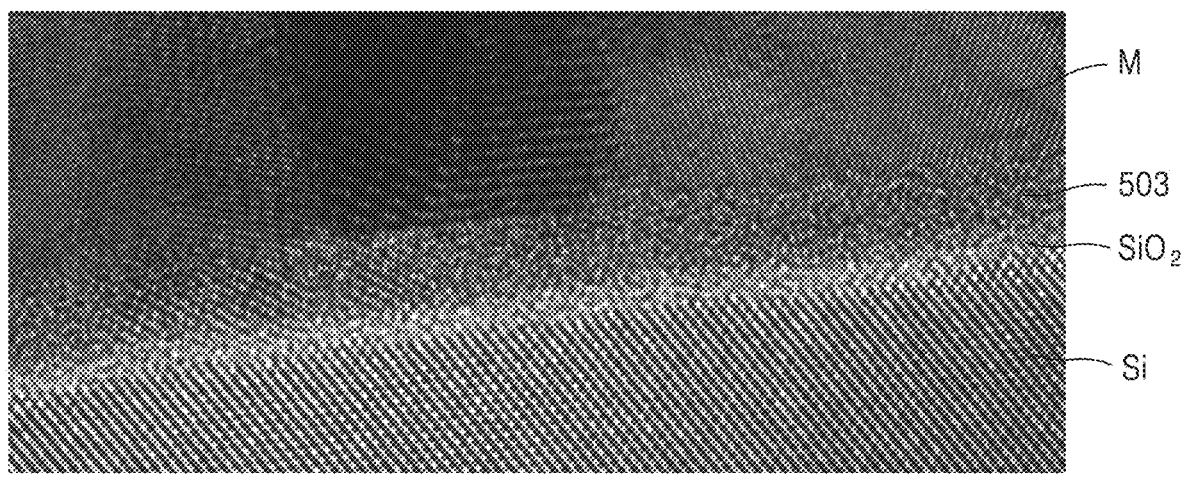
FIG. 8B is an electron microscope photograph of the dielectric layer of FIG. 8A.

FIG. 8A is a cross-sectional view illustrating another example structure of a dielectric layer employed in a thin film structure according to still another embodiment, and FIG. 8B is an electron microscope photograph of the dielectric layer of FIG. 8A.

A dielectric layer 503 includes a first layer 31 including $HfO_2$ prepared in i-cycles, and an uppermost layer UP3 including $ZrO_2$ prepared in j-cycles (j>i). The thicknesses of the first layer 31 and the uppermost layer UP3 may be i*t and j*t, respectively. t may be about 0.3 nm to 0.8 nm. j may be 3 or more. The thickness of the uppermost layer UP3 may be about 25 nm or more.

The dielectric layer 503 may further include a second layer 32 disposed on the first layer 31 and including $ZrO_2$ prepared in i-cycles, and a third layer 33 disposed on the second layer 32 and including $HfO_2$ prepared in j-cycles. Pairs of the first layer 31 and the second layer 32 may be repeatedly disposed under the third layer 33 several times. The number of repeated times may be determined in consideration of the overall thickness of the dielectric layer 503 to be formed.

In the case where the content ratio of Hf and Zr in the dielectric layer 503 of the present embodiment is 1:1, the dielectric layer 503 forms $Hf_{0.5}Zr_{0.5}O_2$. According to the composition, the first layer 31 and the second layer, adjacent to each other, are set to have the same thickness, whereas the uppermost layer UP2 and the third layer 33 adjacent thereto are set to be thicker than the first layer 31 and the second layer 32.

The thin film structure shown in FIG. 8B is formed in the order of Si layer/$SiO_2$ layer/dielectric layer 503/metal layer M. In the dielectric layer 503, as shown in FIG. 8A, the first layers 31 prepared in 1-cycle and the second layers 32 prepared in 1-cycle are repeatedly disposed six times, and each of the third layer 33 and the uppermost layer UP3 is prepared in 6-cycles to form $Hf_{0.5}Zr_{0.5}O_2$. The dielectric layer 503 exhibits good crystallinity as shown in the drawing.

Figure 9A:
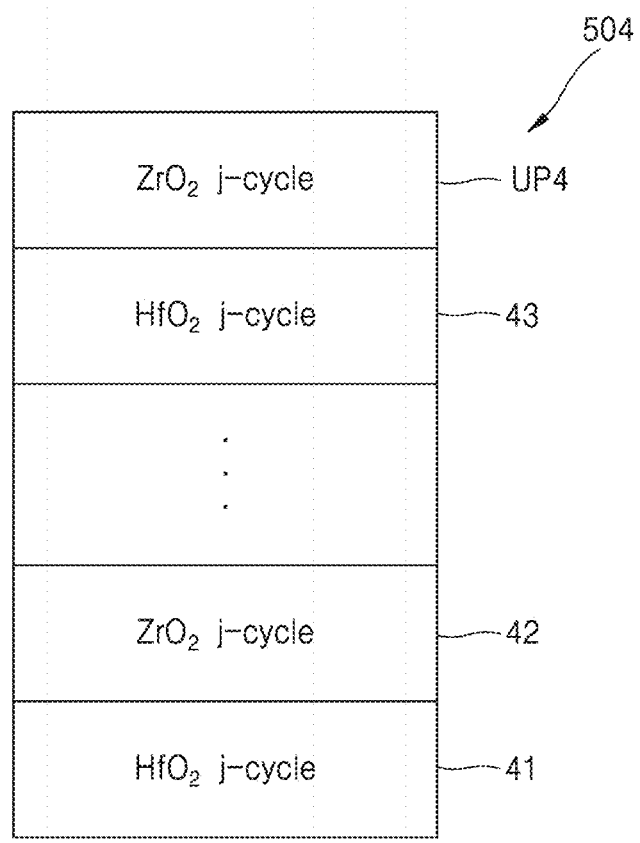
FIG. 9A is a cross-sectional view illustrating another example structure of a dielectric layer employed in a thin film structure according to still another embodiment.
Figure 9B:
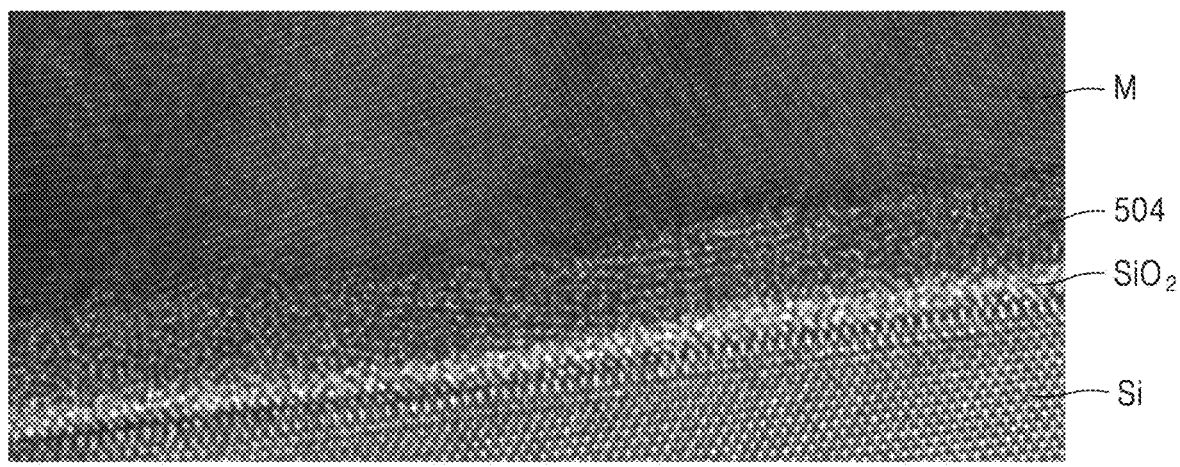
FIG. 9B is an electron microscope photograph of the dielectric layer of FIG. 9A.

FIG. 9A is a cross-sectional view illustrating another example structure of a dielectric layer employed in a thin film structure according to still another embodiment. FIG. 9B is an electron microscope photograph of the dielectric layer of FIG. 9A.

A dielectric layer 504 includes a first layer 41 including $HfO_2$ prepared in j-cycles, and an uppermost layer UP4 including $ZrO_2$ prepared in j-cycles. j may be 3 or more. The thickness of the uppermost layer UP4 may be about 25 nm or more.

The dielectric layer 504 may further include a second layer 42 disposed on the first layer 41 and including $ZrO_2$ prepared in j-cycles, and a third layer 43 disposed on the second layer 42 and including $HfO_2$ prepared in j-cycles. Pairs of the first layer 41 and the second layer 42 may be repeatedly disposed under the third layer 43 several times. The number of repeated times may be determined in consideration of the overall thickness of the dielectric layer 504 to be formed.

In the case where the content ratio of Hf and Zr in the dielectric layer 504 of the present embodiment is 1:1, the dielectric layer 504 forms $Hf_{0.5}Zr_{0.5}O_2$, and the plurality of layers are set to have the same thickness.

FIG. 9B is an electron microscope photograph illustrating a case where j is set to 4, the first layers and the second layers are repeatedly formed two times, and the third layer 43 and the uppermost layer UP3 are formed. That is, FIG. 9B is an electron microscope photograph illustrating a case where $Hf_{0.5}Zr_{0.5}O_2$ having a thickness of 12 t was fabricated from the dielectric layer 503 in which the $HfO_2$ layer and the $ZrO_2$ layer were laminated three times in 4-cycles. As shown in the drawing, good crystallinity is exhibited.

Figure 10A:
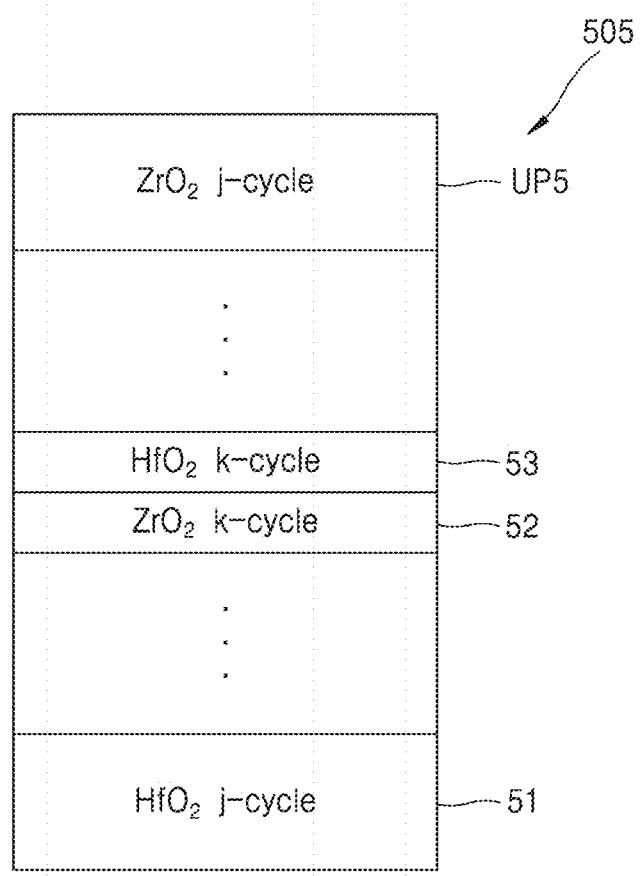
FIG. 10A is a cross-sectional view illustrating another example structure of a dielectric layer employed in a thin film structure according to still another embodiment.
Figure 10B:
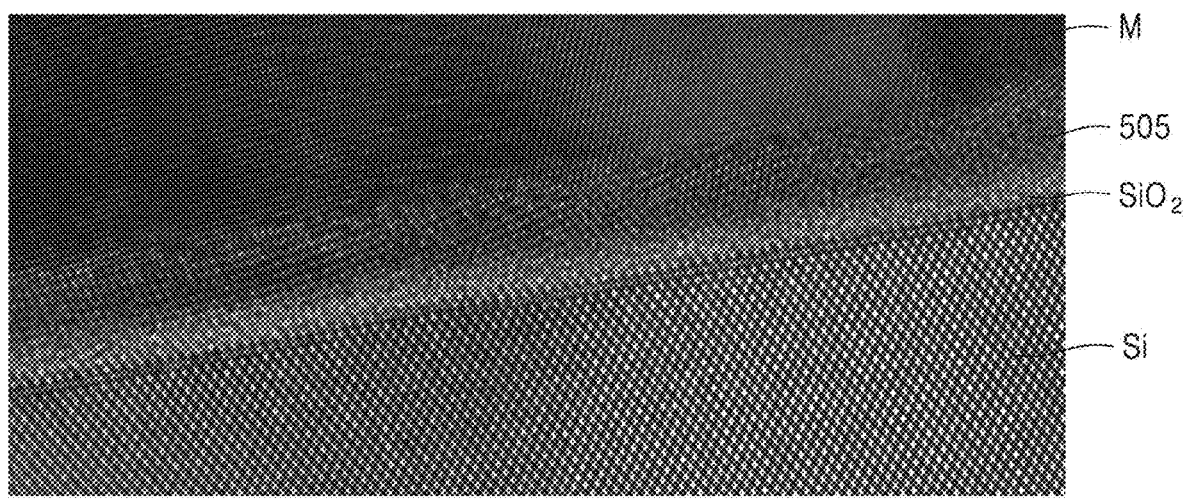
FIG. 10B is an electron microscope photograph of the dielectric layer of FIG. 9A.

FIG. 10A is a cross-sectional view illustrating another example structure of a dielectric layer employed in a thin film structure according to still another embodiment, and FIG. 10B is an electron microscope photograph of the dielectric layer of FIG. 10A.

A dielectric layer 505 includes a first layer 51 including $HfO_2$ prepared in j-cycles, and an uppermost layer UP5 including $ZrO_2$ prepared in j-cycles.

The dielectric layer 505 may further include a second layer 52 disposed on the first layer 51 and including $ZrO_2$ prepared in k-cycles (k<j), and a third layer 53 disposed on the second layer 52 and including $HfO_2$ prepared in k-cycles (k<j). Pairs of the second layer 52 and the third layer 53 may be repeatedly disposed between the first layer 51 and the uppermost layer UP5. The number of repeated times may be determined in consideration of the overall thickness of the dielectric layer 505 to be formed.

In the case where the content ratio of Hf and Zr in the dielectric layer 505 of the present embodiment, similarly to the dielectric layers 503 and 504, is 1:1, the dielectric layer 505 forms $Hf_{0.5}Zr_{0.5}O_2$. In the dielectric layer 505 of the present embodiment, the first layer 51 and the uppermost layer UP5 are formed to have the same thickness, and the second layers 52 and third layers 53, each being thinner than the uppermost layer UP5, are repeatedly disposed between the first layer 51 and the uppermost layer UP5.

The electron microscope photography of FIG. 10B shows the dielectric layer 505 in which $ZrO_2$ layers prepared in 1-cycle and $HfO_2$ layers prepared in 1-cycle are repeatedly laminated five times between a $HfO_2$ layer prepared in 5-cycles and a $ZrO_2$ layer (uppermost layer) prepared in 5-cycles to form $Hf_{0.5}Zr_{0.5}O_2$. As shown in the drawing, the dielectric layer 505 exhibits good crystallinity.

Although it is illustrated in the embodiments of FIGS. 8A, 9A and 10A that the uppermost layer is set as a $ZrO_2$ layer when the content of Hf in each of the dielectric layer 503, 504, and 505 is equal to the content of Zr in each of the dielectric layer 503, 504, and 505, in another embodiment, even in this case, the uppermost layer may be set as a $ZrO_2$ layer, and may be set to be thickest.

Figure 11:
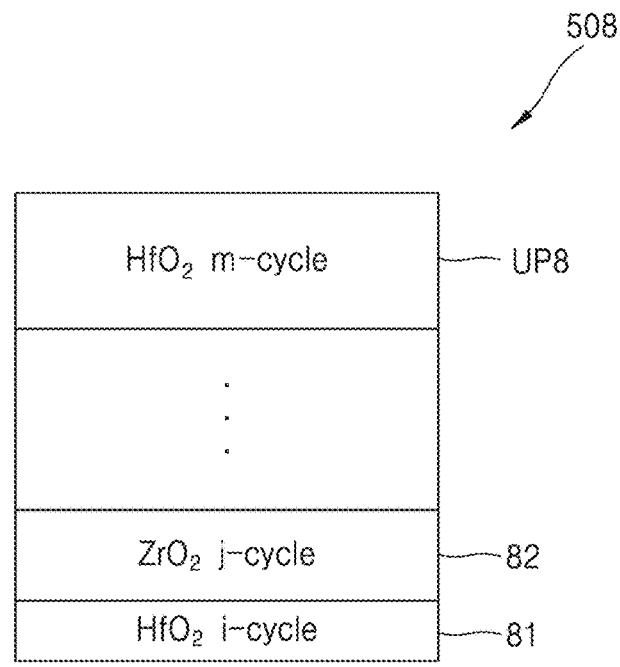
FIG. 11 is a cross-sectional view illustrating another example structure of a dielectric layer employed in a thin film structure according to still another embodiment.

FIG. 11 is a cross-sectional view illustrating another example structure of a dielectric layer employed in a thin film structure according to still another embodiment.

A dielectric layer 508 includes a first layer 81 including $HfO_2$ prepared in i-cycle, a second layer 82 including $ZrO_2$ prepared in j-cycle (j>i), and an uppermost layer UP8 including $HfO_2$ prepared in m-cycles (m>i, j). That is, the first layer 81 is an $HfO_2$ layer having a thickness of i*t, the second layer 82 is a $ZrO_2$ layer having a thickness of j*t, and the uppermost layer UP8 is a $HfO_2$ layer having a thickness of m*t (m>i, j). Among these layers, the uppermost layer UP8 is thickest.

The plurality of first layers 81 and the plurality of second layers 82 may repeatedly disposed. For example, the first layers 81 and the second layers 82 may repeatedly disposed R times. When the content of Hf in the dielectric layer 508 is equal to the content of Zr in the dielectric layer 508, m=R*(j−i) may be satisfied. For example, m=6, R=3, j=3, and i=1 may be satisfied. In addition, the dielectric layer 508 may be formed in various forms.

Figure 12A:
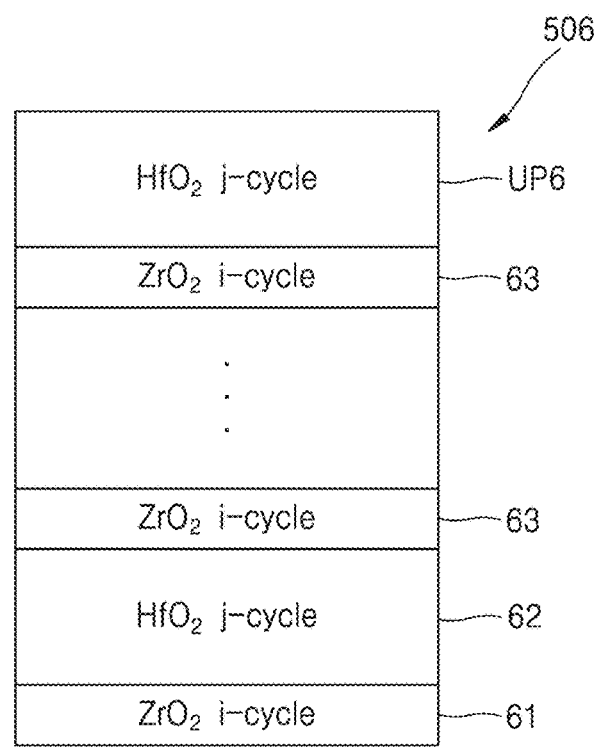
FIG. 12A is a cross-sectional view illustrating another example structure of a dielectric layer employed in a thin film structure according to still another embodiment.
Figure 12B:
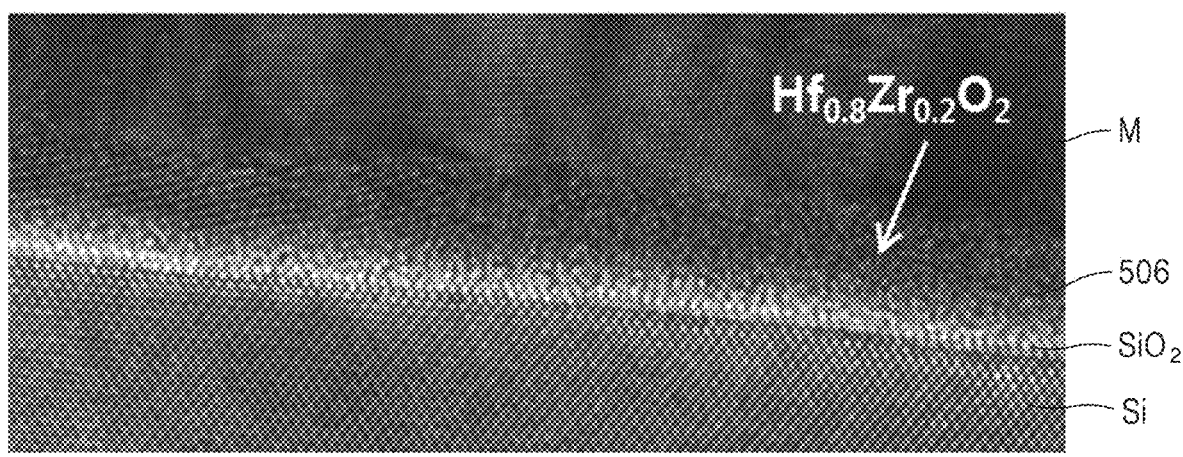
FIG. 12B is an electron microscope photograph of the dielectric layer of FIG. 12A.

FIG. 12A is a cross-sectional view illustrating another example structure of a dielectric layer employed in a thin film structure according to still another embodiment. FIG. 12B is an electron microscope photograph of the dielectric layer of FIG. 12A.

A dielectric layer 506 of the present embodiment is different from the aforementioned embodiments in that a>b is satisfied when the content ratio of Hf and Zr is a:b.

The dielectric layer 506 includes a first layer 61 including $ZrO_2$ prepared in i-cycles and having a thickness of i*t (i is an integer, and t is a real number), and an uppermost layer UP6 including $HfO_2$ prepared in j-cycles and having a thickness of j*t (j>i, j is an integer of 3 or more).

The dielectric layer 506 may further include a second layer 62 disposed on the first layer 61, having a thickness of j*t and including $HfO_2$, and a third layer 63 disposed on the second layer 62, having a thickness of i*t and including $ZrO_2$. Pairs of the second layer 62 and the third layer 63 may be repeatedly disposed between the first layer 62 and the uppermost layer UP6 several times.

FIG. 12B is an electron microscope photograph of the dielectric layer 506 of FIG. 12A, and illustrates a case where i=1 and j=4 are satisfied, and pairs of $HfO_2$ 1-cycle and $ZrO_2$ 4-cycles are repeated five times. The thin film shown in FIG. 12B is formed in the order of Si layer/$SiO_2$ layer/dielectric layer 506/metal layer M. The dielectric layer 502 forms $Hf_{0.8}Zr_{0.2}O_2$. The dielectric layer 506 exhibits good crystallinity as shown in the drawing.

Figure 13:
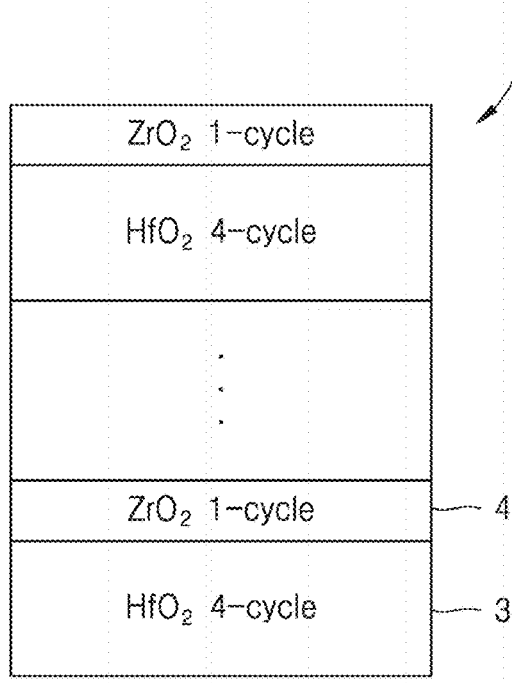
FIG. 13 is a cross-sectional view illustrating a structure of a comparative dielectric layer to be compared with the dielectric layer of FIG. 12A.

FIG. 13 is a cross-sectional view illustrating an example structure of a comparative dielectric layer to be compared with the dielectric layer of FIG. 12A.

A dielectric layer 55 is configured such that pairs of a $HfO_2$ layer 3 prepared in 4-cycles and a $ZrO_2$ layer prepared in 1-cycle are repeatedly disposed, and is different from the aforementioned dielectric layer 506 in the placement order of the pairs thereof. Unlike the aforementioned dielectric layer 506, the comparative dielectric layer 55 is configured such that its uppermost layer thereof is formed as the $ZrO_2$ layer 4 thinner than the $HfO_2$ layer 3.

Figure 14:
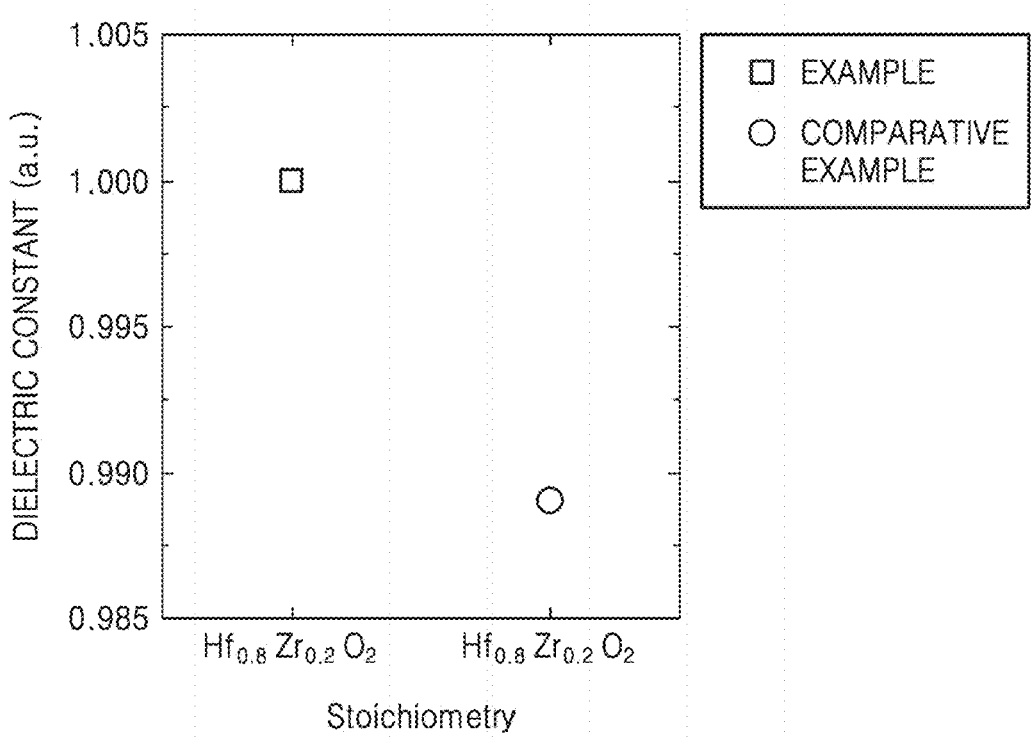
FIG. 14 is a graph comparing a dielectric constant of the dielectric layer of FIG. 12A with a dielectric constant of the comparative dielectric layer of FIG. 11.

FIG. 14 is a graph comparing a dielectric constant of the dielectric layer of FIG. 12A with a dielectric constant of the comparative dielectric layer 5 of FIG. 11.

Referring to FIG. 14, it may be found that, even in the cases of $Hf_{0.8}Zr_{0.2}O_2$ having the same composition, the dielectric constant is changed depending on the method and the resulting structure. It may be found that the dielectric constant of the dielectric layer 506 in which a thick $HfO_2$ layer is disposed as the uppermost layer UP6 is higher than that of the comparative dielectric layer 5.

The reason for this is analyzed in that the kind and thickness of the uppermost layer UP6 contacting the conductive material disposed on the dielectric layer 506 are appropriately set, thereby making the crystallinity of $Hf_{0.8}Zr_{0.2}O_2$ good.

Although it is illustrated in the embodiment of FIG. 12A that the uppermost layer is set as a $HfO_2$ layer when the content of Hf in the dielectric layer 506 is higher than the content of Zr in the dielectric layer 506, in another embodiment, even in this case, the uppermost layer may be set as a $ZrO_2$ layer, and may be set to be thickest.

Figure 15:
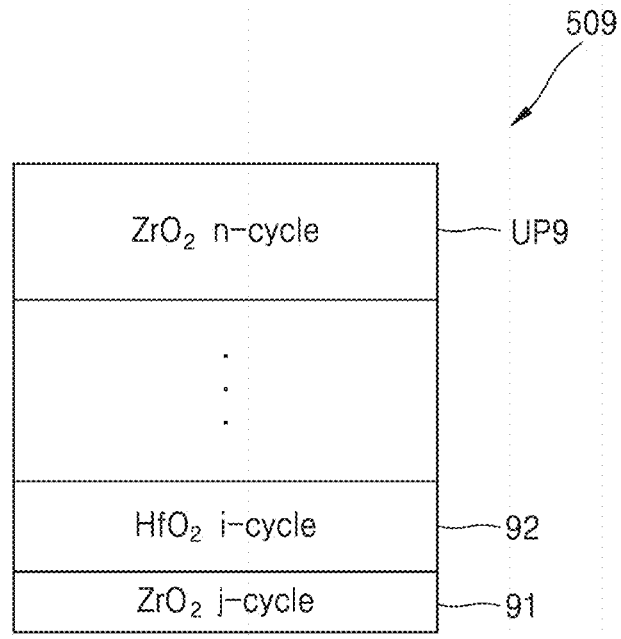
FIG. 15 is a cross-sectional view illustrating another example structure of a dielectric layer employed in a thin film structure according to still another embodiment.

FIG. 15 is a cross-sectional view illustrating another example structure of a dielectric layer employed in a thin film structure according to still another embodiment.

A dielectric layer 509 includes a first layer 91 including $ZrO_2$ prepared in j-cycles, a second layer 92 including $HfO_2$ prepared in i-cycles (i>j), and an uppermost layer UP9 including $ZrO_2$ prepared in n-cycles (n>i, j). That is, the first layer 91 is a $ZrO_2$ layer having a thickness of j*t, the second layer 92 is a $HfO_2$ layer having a thickness of i*t, and the uppermost layer UP9 is a $ZrO_2$ layer having a thickness of n*t (n>i, j). Among these layers, the uppermost layer UP9 is thickest.

The plurality of first layers 91 and the plurality of second layers 92 may repeatedly disposed. For example, the first layers 91 and the second layers 92 may repeatedly disposed R times. When the content of Hf in the dielectric layer 509 is higher than the content of Zr in the dielectric layer 509, n<R*(j−i) may be satisfied. For example, n=5, R=3, j=3, and I=1 may be satisfied. In addition, the dielectric layer 509 may be formed in various forms.

Figure 16:
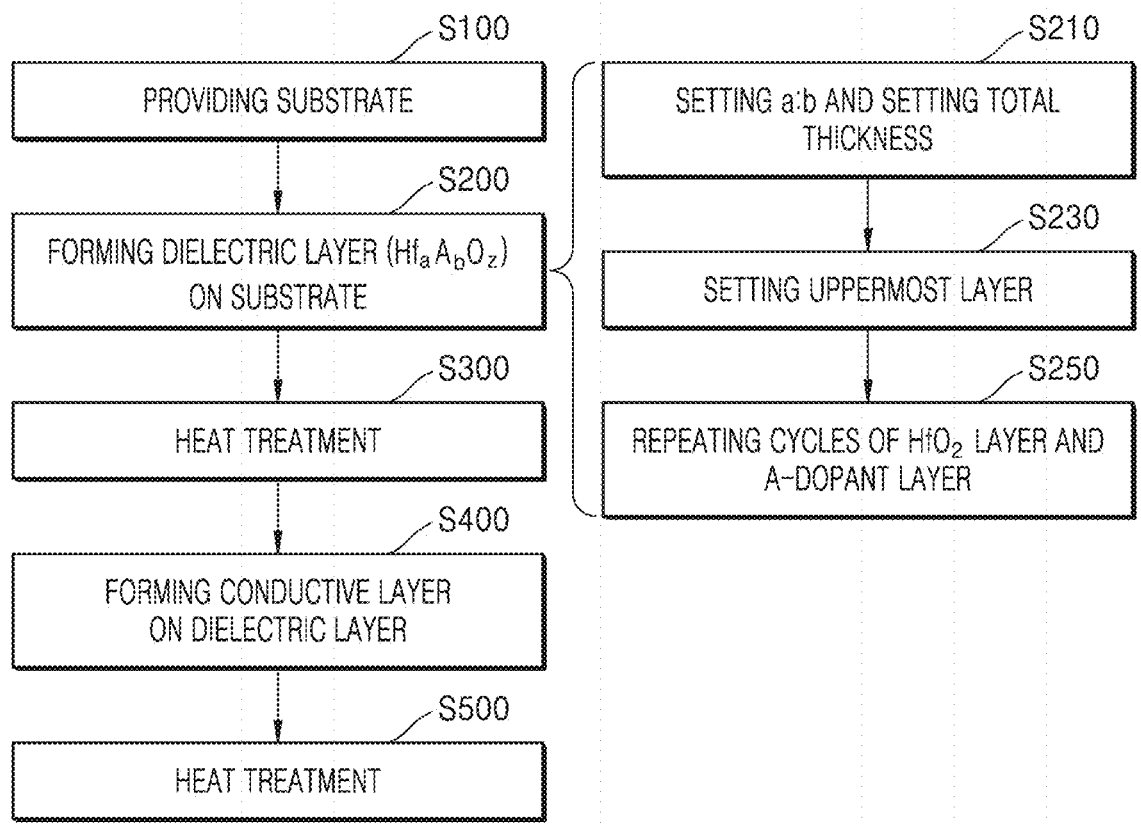
FIG. 16 is a flowchart schematically illustrating operations of a method of manufacturing a thin film structure according to an embodiment.

FIG. 16 is a flowchart schematically illustrating operations of a method of manufacturing a thin film structure according to an embodiment.

The method of manufacturing a thin film structure according to an embodiment includes the operations of: providing a substrate (S100); forming a dielectric layer on the substrate (S200); and forming a conductive layer on the dielectric layer (S500).

The substrate is a target substrate on which the dielectric layer is to be formed, and the kind thereof is not limited thereto.

The dielectric layer is formed of a plurality of layer including a dopant layer containing a dopant A and a $HfO_2$ layer, to form a compound of $Hf_aA_bO_z$. In this case, among the plurality of layers, the uppermost layer thereof is formed to be thickest.

The dopant A may include any one of transition metals such as Zr, La, and Y, Si, Al, and Sn, and may be made of binary or ternary or more. The dopant layer may include any one of transition metal-based oxide such as $ZrO_2$, $LaO_2$, or $YO_2$, and $SiO_2$, $Al_2O_3$, and $SnO_2$.

The conductive layer may include any one of a metal such as TiN, W, Mo, or Ni; a conductive oxide such as $RuO_2$, $SrRuO_3$, or ITO; and a 2D material such as graphene. The conductive layer may include metal nitride or metal oxynitride.

In order to form the dielectric layer and the conductive layer, deposition methods, such as atomic layer deposition (ALD), metal organic atomic layer deposition (MOALD), chemical vapor deposition (CVD), metal organic chemical vapor deposition (MOCVD), and physical vapor deposition (PVD) may be used.

In order to form the dielectric layer, first, the operation S210 of determining the composition ratio a:b of Hf and A and determining the total thickness; the operation S230 of setting the uppermost layer; and the operation S250 of repeating the cycles of the $HfO_2$ layer and the A-dopant layer may be performed.

The operation S230 of setting the uppermost layer is a procedure of determining the kind and thickness of the uppermost layer to obtain an optimal dielectric constant in the composition ratio and thickness defined in consideration of the determined a:b and total thickness. As in the explanation of the aforementioned dielectric layers 500 to 509, the uppermost layer may be determined so as to prepare a compound of $Hf_aA_bO_z$ having good crystallinity.

For example, when the content ration is a:b, the uppermost layer may be set as an A-dopant layer in the case of a≤b, and the uppermost layer may be set as a $HfO_2$ layer in the case of a>b. Alternatively, the uppermost layer may be set as a $HfO_2$ layer even in the case of a≤b, and the uppermost layer may be set as an A-dopant layer even in the case of a>b. Next, in order for the uppermost layer to have the maximum thickness, the thicknesses, repetition number and positions of other layers, that is, the $HfO_2$ layer and the A-dopant layer may be set in consideration of the total content ratio and process conditions.

After the dielectric layer is formed, heat treatment may be performed (S300). However, this operation may be omitted.

Next, after the conductive layer is formed on the dielectric layer, heat treatment may be performed (S500). This heat treatment is used for accelerating the crystallization of the dielectric layer. Here, both operations may be performed, or only one operation may be selectively performed.

Figure 17:
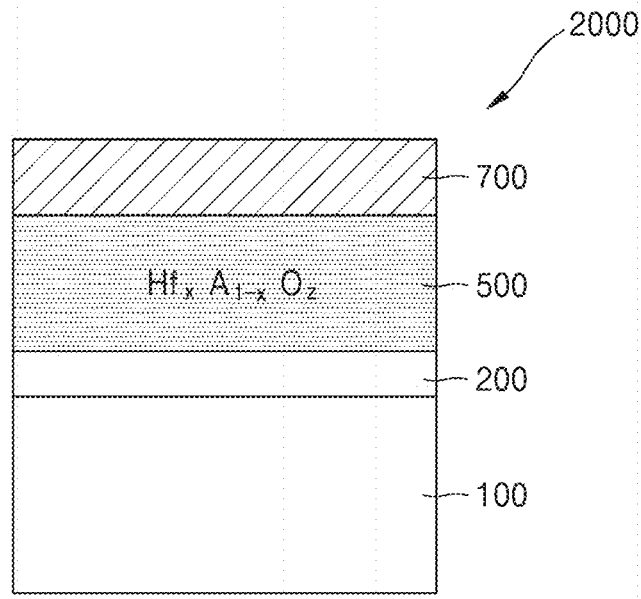
FIG. 17 is a cross-sectional view illustrating the schematic structure of an electronic device according to an embodiment.

FIG. 17 is a cross-sectional view illustrating the schematic structure of an electronic device according to an embodiment.

An electronic device 2000 may include a semiconductor layer 100, an insulating layer 200 formed on the semiconductor layer 100, a dielectric layer 500 formed on the insulating layer 200, and a first conductive layer 700 formed on the dielectric layer 500.

The semiconductor layer 100 may include a semiconductor substrate. The semiconductor substrate may include a silicon substrate, a germanium substrate, or a silicon-germanium substrate. The semiconductor layer 100 may include at least one selected from Al, Si, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, Hf, Ta, W, Re, Os, Ir, Pt, and Au, or may include a nitride or oxide of the at least one.

The insulating layer 200 may be a layer for suppressing or preventing electrical leakage. As the insulating layer 200, a silicon oxide (SiO) layer, an aluminum oxide (AlO) layer, a hafnium oxide (HfO) layer, a zirconium oxide (ZrO) layer, or a two-dimensional (2D) insulator may be used. As the 2D insulator, a material such as hexagonal boron nitride (h-BN) may be used. However, the material of the insulating layer 200 is not limited thereto.

The dielectric layer 500 may be any one of the aforementioned dielectric layers 500, 501, 502, 503, 504, 505, and 506. The dielectric layer 500 may function as a ferroelectric domain switching layer.

The first conductive layer 700 may include any one of a metal such as TiN, W, Mo, or Ni; a conductive oxide such as $RuO_2$, $SrRuO_3$, or ITO; and a 2D material such as graphene. The conductive layer may include metal nitride or metal oxynitride.

The first conductive layer 700 may be a gate electrode. A source electrode (not shown) and a drain electrode (not shown) may be connected to the semiconductor layer 100. A source region (not shown) and a drain region (not shown) may be provided on the semiconductor layer 100, and a source electrode and a drain electrode may be connected to the source region and the drain region, respectively. A channel region, which is a region of the semiconductor layer, may be disposed between the source region and the drain region.

The aforementioned electronic device 2000 may be a logic transistor.

Figure 18:
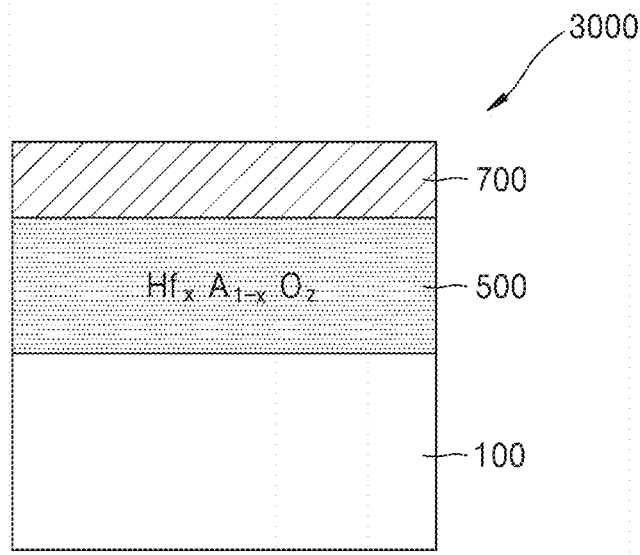
FIG. 18 is a cross-sectional view illustrating the schematic structure of an electronic device according to another embodiment.

FIG. 18 is a cross-sectional view illustrating the schematic structure of an electronic device according to another embodiment.

An electronic device 3000 of the present embodiment is different from the electronic device 2000 of FIG. 17 in that an insulating layer is not provided, and is substantially the same as the electronic device 2000 of FIG. 17 in other components.

Figure 19:
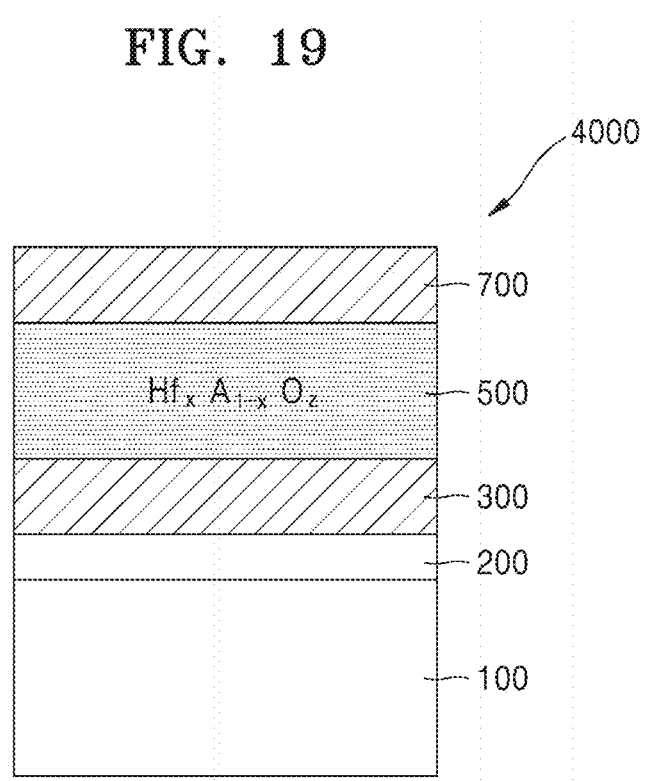
FIG. 19 is a cross-sectional view illustrating the schematic structure of an electronic device according to still another embodiment.

FIG. 19 is a cross-sectional view illustrating the schematic structure of an electronic device according to still another embodiment.

An electronic device 4000 of the present embodiment is different from the electronic device 2000 of FIG. 17 in that a second conductive layer 300 is further provided, and is substantially the same as the electronic device 2000 of FIG. 17 in other components.

The electronic devices of FIGS. 17 to 19 may function as transistor devices.

Figure 20:
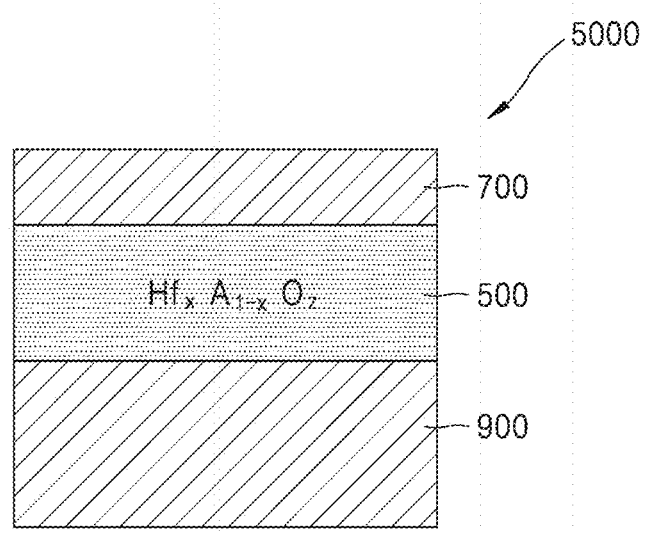
FIG. 20 is a cross-sectional view illustrating the schematic structure of an electronic device according to still another embodiment.

FIG. 20 is a cross-sectional view illustrating the schematic structure of an electronic device according to still another embodiment.

An electronic device 5000 includes a second conductive layer 900, a dielectric layer 500 formed on the second conductive layer 900, and a first conductive layer 700 formed on the dielectric layer 500. The dielectric layer 500 may be any one of the aforementioned dielectric layers 500, 501, 502, 503, 504, 505, and 506.

Figure 21:
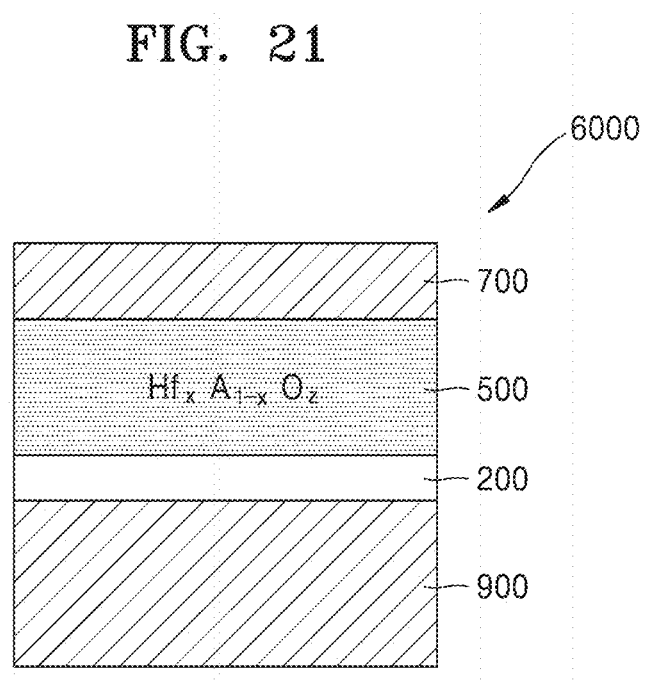
FIG. 21 is a cross-sectional view illustrating the schematic structure of an electronic device according to still another embodiment.

FIG. 21 is a cross-sectional view illustrating the schematic structure of an electronic device according to still another embodiment.

An electronic device 6000 of the present embodiment is different from the electronic device 5000 of FIG. 20 in that an insulating layer 200 is further provided between the second conductive layer 900 and the dielectric layer 500, and is substantially the same as the electronic device 5000 of FIG. 20 in other components.

The electronic devices 5000 and 6000 of FIGS. 20 and 21 may be capacitors, and may include a high dielectric constant dielectric layer 5000 to exhibit high capacitance.

Figure 22:
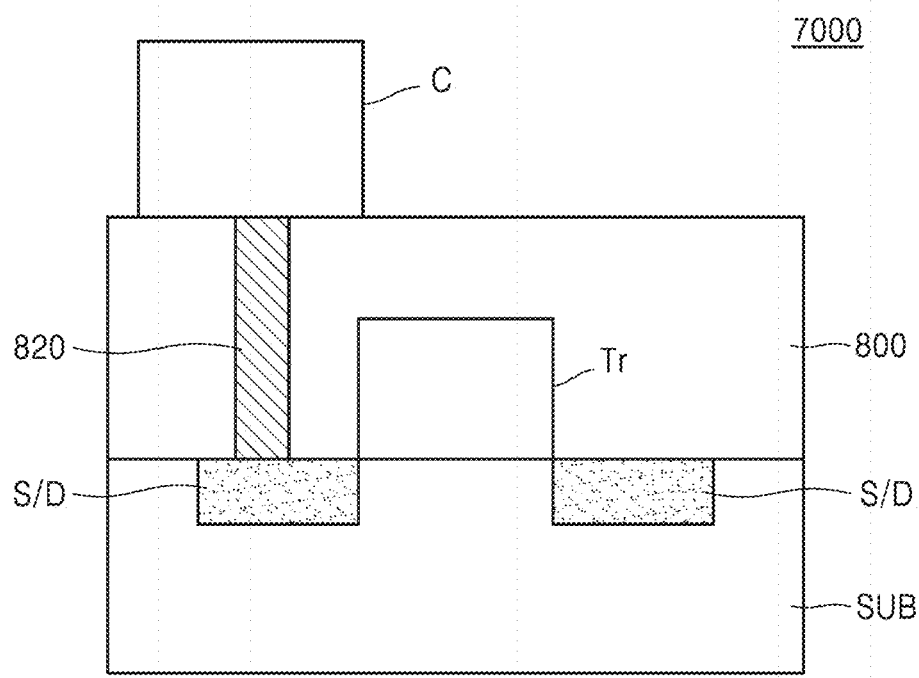
FIG. 22 is a cross-sectional view illustrating the schematic structure of an electronic device according to still another embodiment.

FIG. 22 is a cross-sectional view illustrating the schematic structure of an electronic device according to still another embodiment.

Referring to FIG. 22, in an embodiment, an electronic device 7000 may 7000 may include a substrate SUB including source/drain regions S/D spaced apart from each other, a transistor structure Tr on the substrate SUB between the source/drain regions S/D, an insulation film 800 on the substrate SUB and transistor structure Tr, a capacitor C on the insulation film 800, and a contact 820 extending through the insulation film 800 to electrically connect the capacitor C to one of the source/drain regions S/D. The substrate SUB may be the same as the substrate 100 in FIGS. 17-19. The insulation film 800 may be an insulating material (e.g., silicon oxide). The source/drain region S/D may be regions of the substrate SUB doped with impurities. The capacitor C may be one of the electronic devices 5000 and 6000 in FIGS. 20 and 21, but is not limited thereto. The transistor structure Tr may be one of the electronic devices 2000, 3000, and 4000 in FIGS. 17-19, but is not limited thereto.

The aforementioned electronic devices 2000, 3000, 4000, 5000, 6000, and 7000 may form integrated devices. The integrated device may form a part of a silicon-based integrated circuit, and this integrated circuit may include a plurality of capacitors, a plurality of transistors, and a plurality of memory devices. Such a device may be provided with a dielectric layer having high dielectric constant or ferroelectricity, thereby achieving desired high performance and miniaturization.

According to the above-described thin film structure and manufacturing method thereof, a dielectric layer having good crystallinity and high dielectric constant is provided.

The above-described thin film structure may be employed in various electronic devices such as transistors, capacitors, integrated circuit devices, and such electronic devices may exhibit good operating performance.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A thin film structure, comprising:
a dielectric layer including a plurality of layers to form a compound of $Hf_xZr_{1-x}O_z$, the plurality of layers including a first layer, a second layer on the first layer, and an uppermost layer over the second layer, and
a first conductive layer on the dielectric layer, the first conductive layer directly contacting the uppermost layer of the plurality of layers in the dielectric layer, wherein
in the compound of $Hf_xZr_{1-x}O_z$, $0<x<1$, z is a real number,
the uppermost layer includes $HfO_2$,
none of the plurality of layers in the dielectric layer are thicker than the uppermost layer of the dielectric layer,
the first layer includes $HfO_2$ and has a thickness of i*t (i is an integer, and t is a real number),
the second layer includes $ZrO_2$ and has a thickness of j*t (j is an integer and j>i), and
the uppermost layer has a thickness of k*t (k is and integer and k>i, j).

2. The thin film structure of claim 1, wherein t is 0.05 nm or more.

3. The thin film structure of claim 1, wherein pairs of the first layer and the second layer are repeatedly disposed under the uppermost layer.

4. The thin film structure of claim 3, wherein repeated number of the pairs of the first layer and second layer is R, and
k≤R*(j−i).

5. The thin film structure of claim 1, wherein the dielectric layer has a thickness of about 0.5 nm to about 20 nm.

6. The thin film structure of claim 1, wherein the first conductive layer includes any one of a metal, a conductive oxide, and graphene.

7. The thin film structure of claim 6, wherein the first conductive layer includes the metal.

8. The thin film structure of claim 6, wherein the first conductive layer includes the conductive oxide.

9. The thin film structure of claim 6, wherein the first conductive layer includes the graphene.

10. An electronic device, comprising:
a semiconductor layer; and
the thin film structure of claim 1, on the semiconductor layer.

11. The electronic device of claim 10, further comprising:
an insulating layer between the semiconductor layer and the thin film structure.

12. The electronic device of claim 11, further comprising:
a second conductive layer between the insulating layer and the thin film structure.

13. An electronic device, comprising:
a second conductive layer; and
the thin film structure of claim 1, on the second conductive layer.

14. The electronic device of claim 13, further comprising:
an insulating layer between the second conductive layer and the thin film structure.

* * * * *